United States Patent
Kaiser et al.

(10) Patent No.: US 7,296,198 B2
(45) Date of Patent: Nov. 13, 2007

(54) METHOD FOR TESTING SEMICONDUCTOR MEMORY MODULES

(75) Inventors: Robert Kaiser, Kaufering (DE); Florian Schamberger, Bad Reichenhall (DE)

(73) Assignee: Infineon Technologies AG, Munich (DE)

( * ) Notice: Subject to any disclaimer, the term of this patent is extended or adjusted under 35 U.S.C. 154(b) by 484 days.

(21) Appl. No.: 10/126,376

(22) Filed: Apr. 19, 2002

(65) Prior Publication Data
US 2002/0157049 A1 Oct. 24, 2002

(30) Foreign Application Priority Data
Apr. 19, 2001 (DE) ................................. 101 19 144

(51) Int. Cl.
*G11C 29/00* (2006.01)
(52) U.S. Cl. ...................................... 714/723; 714/719
(58) Field of Classification Search ................ 714/718, 714/719, 720, 723, 710, 711
See application file for complete search history.

(56) References Cited

U.S. PATENT DOCUMENTS

| 5,859,804 A | 1/1999 | Hedberg et al. |
|---|---|---|
| 5,909,448 A | 6/1999 | Takahashi |
| 6,145,092 A | 11/2000 | Beffa et al. |
| 6,279,129 B1 | 8/2001 | McConnell et al. |
| 6,373,758 B1 * | 4/2002 | Hughes et al. ............... 365/200 |
| 6,594,788 B1 * | 7/2003 | Yasui .......................... 714/710 |
| 2001/0043498 A1 | 11/2001 | Dauhn et al. |
| 2001/0052093 A1 * | 12/2001 | Oshima et al. .............. 714/719 |

FOREIGN PATENT DOCUMENTS

WO    WO98/58386    12/1998

* cited by examiner

*Primary Examiner*—James C. Kerveros
(74) *Attorney, Agent, or Firm*—Laurence A. Greenberg; Werner H. Stemer; Ralph E. Locher

(57) ABSTRACT

A method for testing semiconductor memory modules in which data are stored in banks with an addressable matrix structure containing rows and columns. Defect addresses of the defect locations in the banks are transmitted in compressed form to an external test device. The rows and/or the columns are subdivided into regions. The defects occurring in the respective region are counted row by row and/or column by column. The number of defects in each region is compared row by row and/or column by column with a threshold value, and the comparison results are transmitted as additional information row by row and/or column by column together with the defect addresses to a test device.

22 Claims, 1 Drawing Sheet

METHOD FOR TESTING SEMICONDUCTOR MEMORY MODULES

BACKGROUND OF THE INVENTION

Field of the Invention

The invention relates to a method for testing semiconductor memory modules in which data are stored in banks with an addressable matrix structure containing rows and columns, and in which defect addresses of defect locations in the banks are transmitted in compressed form to an external test device.

Because of their fabrication process, semiconductor memory modules have hitherto unavoidably exhibited defect locations in their memory areas. The defect locations are identified by defect addresses of memory banks arranged in a matrix-like manner in rows and columns. After a memory module has been fabricated, but before the memory module is released, the memory module is tested using a so-called self-test. This self-test utilizes an external test device that is connected to a memory module via a data transmission line and to which the found defect addresses are supplied in the course of the self-test. In order to keep the outlay on apparatus in the context of testing as low as possible, it has been endeavored to use as few test channels as possible for testing, i.e. the smallest possible number of line connections between the memory module to be tested and the external test device. Therefore, in the case of the self-test method discussed, the defect addresses that have been found are transmitted in compressed form to the test device. What is problematic in this case is that, in the case of a very high degree of compression, so much information is lost that it is no longer possible to draw conclusions about the type of defects, for example cluster defects. Defect addresses prove to be problematic to repair for lack of the conclusions. In the context of this repair, provision is made to replace the defect addresses by replacement addresses. This problem area has hitherto been counteracted by using a lower degree of compression or by transmitting all of the data to the test device, in which they are combined to form a so-called bit fail map. A further approach for surmounting the abovementioned problem is that, during the testing of a row or column, the defective addresses that occur are accumulated up to an adjustable number. As soon as this number of defective addresses is exceeded, a must repair command is communicated to the test device. If the number of defective addresses is not exceeded, then the accumulated defect addresses are transmitted serially to the test device. The transmission to the test device is in this case effected while the next row or column is already being tested.

The previous procedure is associated with the disadvantage, however, that if only a few test channels are available for testing, in the case of a must repair, the defect addresses have to be transmitted in a highly compressed form to the tester. There is the risk that information will be lost, and therefore, conclusions will no longer be able to be made about the type of defects.

U.S. Pat. No. 6,145,092 discloses a method for testing semiconductor memory modules which is herein fully incorporated by reference. Data can be stored in the banks of a matrix structure containing addressable rows and columns, because when a defect occurs, counting is effected row by row and/or column by column, and the number of defects is compared row by row and/or column by column with a threshold value. The comparison result is then transmitted to a tester.

Furthermore, U.S. Pat. No. 5,909,448 discloses a method for testing semiconductor modules in which defect addresses of defect locations in banks are transmitted in compressed form to an external tester.

SUMMARY OF THE INVENTION

It is accordingly an object of the invention to provide a method for testing semiconductor memory modules which overcomes the above-mentioned disadvantages of the prior art methods of this general type.

In particular, it is an object of the invention to provide a method for self-testing semiconductor memory modules of the type mentioned in the introduction which operates reliably using as few tester channels as possible, and which advantageously utilizes the bandwidth of the tester channels.

With the foregoing and other objects in view there is provided, in accordance with the invention, a method for testing a semiconductor memory module that includes steps of: storing data in a memory bank having an addressable matrix structure containing rows and columns; subdividing elements selected from the group consisting of the rows and the columns into regions; counting defect locations occurring in each one of the regions in a manner selected from the group consisting of a row by row manner and a column by column manner; obtaining comparison results by comparing a number of the defect locations in each one of the regions with a threshold value in a manner selected from the group consisting of a row by row manner and a column by column manner; and transmitting the comparison results as additional information in a manner selected from the group consisting of a row by row manner and a column by column manner to an external test device, and transmitting the comparison results to the external test device together with defect addresses of defect locations in the memory bank.

Accordingly, in other words, the invention provides a method for self-testing semiconductor memory modules in which the defect addresses are compressed to be transmitted to the test device using a relatively low degree of compression in comparison with the prior art. This is achieved by virtue of the fact that the rows and/or the columns are subdivided into regions, that the defects occurring in the respective region are counted row by row and/or column by column, that the number of defects in each region is compared row by row and/or column by column with a threshold value, and that the comparison results are transmitted as additional information row by row and/or column by column together with the defect addresses to the test device.

One advantage of the method is that, for a defect analysis in the test device, data that have not been available hitherto are ready in the form of additional information. Furthermore, it is advantageous that a relatively low additional outlay is required to implement the method. This additional outlay amounts to nothing more than additional latches for the additional information and also a comparator and a counter.

Finally, it is also an advantage of the invention that, in its implementation, a small to a non-existent data overhead occurs, because the available test channel bandwidth is not fully utilized in the case of a must repair. In the inventive method, the remaining bandwidth is used for the additional information.

In accordance with an added feature of the invention, the additional information in the form of the comparison results is transmitted in the form of a byte. This additional byte can, if appropriate, also be transmitted only in the case of a must repair, which provides the advantage that the maximum bandwidth is not exceeded.

In accordance with an additional feature of the invention, the additional information is generated when the comparison results are greater than or equal to the threshold value.

In accordance with another feature of the invention, the additional information is qualified depending on whether defect locations are contained in one region or in a plurality of the regions in which the rows and/or columns are subdivided. This qualified additional information is also preferably transmitted in the form of a byte.

The number of regions into which the rows and/or columns are subdivided in order to obtain additional information in the form of the results of the comparison between the threshold value and the number of defects is limited by as little as the threshold value in the context of the invention. A typical number for the regions and the threshold value is 2, 4, 8, . . . , for example. However, it is also perfectly possible to use an odd number of regions, such as three regions, for instance.

Other features which are considered as characteristic for the invention are set forth in the appended claims.

Although the invention is illustrated and described herein as embodied in a method for testing semiconductor memory modules, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The sole drawing FIGURE diagrammatically shows a data bank of a semiconductor memory module.

DESCRIPTION OF THE PREFERRED EMBODIMENTS

Figure 1:
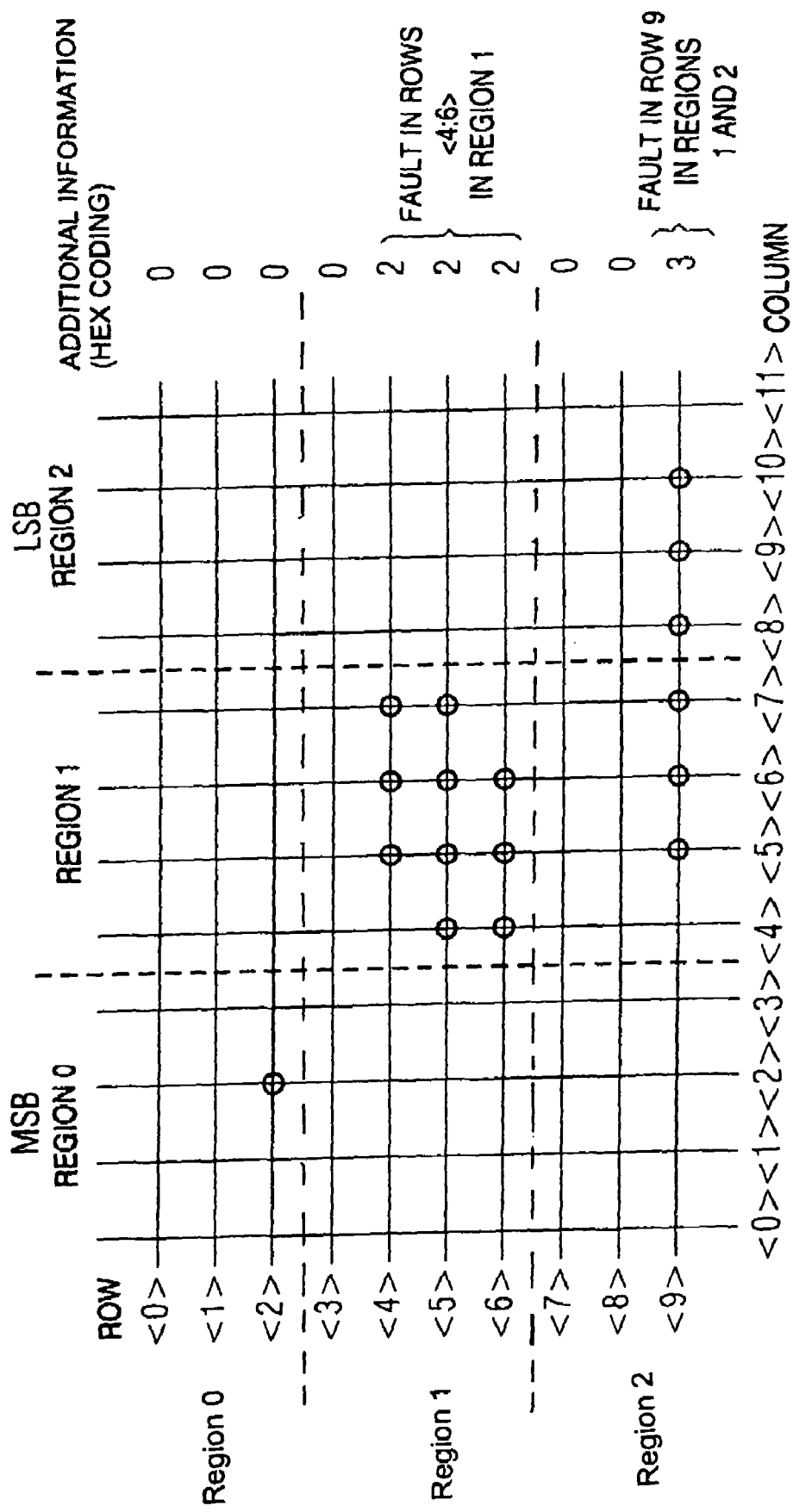

Referring now to the sole drawing FIGURE, there is shown a memory bank (not specifically designated) that is subdivided in a matrix-like manner into nine rows and eleven columns. The locations where the rows and columns intersect define addresses. Defective addresses or defect addresses are represented by circles. Accordingly, a defect address is present at <2,2> i.e. at the point of intersection between the second row and the second column. Further defect addresses are present in the fourth, fifth and ninth rows. In the fourth row, three defect addresses are present next to one another: <4,5>, <4,6>, <4,7>. Four defect addresses are present in the fifth row: <5,4>, <5,5>, <5,6>, <5,7>. Finally, six defect addresses are present in the ninth row: <9,5>, <9,6>, <9,7>, <9,8>, <9,9>, <9,10>.

Furthermore, in the FIGURE, MSB denotes the most significant bit and LSB denotes the least significant bit.

According to the invention, the rows are subdivided into regions. In the present case the rows are divided into three regions—a region 0, a region 1 and a region 2. Region 0 includes the columns <0> to <3>. Region 1 includes the columns <4> to <7> and region 2 includes the columns <8> to <11>.

According to the invention, the rows in the respective region 0, 1 and 0, 1, 2 are compared with a threshold value, which is 3 in the present case. The comparison results, which are preferably hexadecimally coded, are transmitted as additional information, row by row together with the respective defect addresses to a test device (not shown) which carries out the self-test of the semiconductor memory module.

The method sequence is as follows: No defect address is present in row <0>. The comparison with the threshold value 3 thus produces the additional information 0. The same applies to row <1>. Here, too, the additional information is 0.

The abovementioned defect address is present in row <2>. Further defect addresses are not present in this row, for which reason a comparison of this one defect address with the threshold value 3 again produces the additional information 0.

No row defect is present in row <3>, for which reason the additional information again produces 0.

A plurality of defect addresses are present in each of the rows <4>to <6>. The three defect addresses mentioned above are present in the row <4>. A comparison with the threshold value produces the hexadecimal-coded additional information 2. The same result is produced for row <5>, in which the four defect addresses mentioned above are present, i.e. the comparison result for the additional information is 2 in this case as well. Row <6> contains the three defect addresses mentioned above, which again results in the additional information 2. The additional information items 2, 2, 2 in rows <4> to <6> each lie in region 1 and all together represent a cluster defect. This is a qualified additional information item which is transmitted together with the defect addresses to the test device.

In total, row <9> contains the six address defects mentioned above. In row <9> a group of three address defects is in region 1 and a group of three address defects is in region 2. A region-by-region comparison with the threshold value together produces the hexadecimal-coded additional information 3.

As explained above, the additional information in the form of bytes 0, 2 and 3 is transmitted to the test device together with the defect addresses that have been found. This is advantageous particularly when a must repair is reported, because when a must repair occurs, the available test channel bandwidth is not fully used. The remaining bandwidth is available for the additional information.

The example explained above provides a subdivision of the rows into three regions. As an alternative to this, the columns can also be subdivided into a plurality of regions, for example three, and the byte-by-byte transmission of additional information is effected column by column.

We claim:

1. A method for testing semiconductor memory modules, comprising:

storing data in a memory bank having an addressable matrix structure containing rows and columns, and locations where the rows and columns intersect defining addresses;

subdividing the locations of each row into a plurality of regions;

counting defect locations occurring in each one of the regions separately from one another in a row by row manner;

obtaining comparison results by comparing a number of the counted defect locations in each one of the regions with a threshold value separately from one another in a row by row manner; and transmitting the region-by-region comparison results as additional information in a row by row manner to an external test device, and transmitting the comparison results to the external test device together with defect addresses of defect locations in the memory bank.

2. The method according to claim 1, which comprises: providing the threshold value being greater than 2.

3. The method according to claim 1, which comprises; providing the threshold value being greater than 1.

4. The method according to claim 3, which comprises: transmitting the additional information as a byte.

5. The method according to claim 4, which comprises: generating the additional information if the comparison results are not less than the threshold value.

6. The method according to claim 3, which comprises: generating the additional information if the comparison results are not less than the threshold value.

7. The method according to claim 1, which comprises: generating the additional information if the comparison results are not less than the threshold value.

8. The method according to claim 1, which comprises: transmitting the additional information as a byte.

9. The method according to claim 1, which comprises: qualifying the additional information depending on whether the defect locations are contained in one of the regions or in a plurality of the regions.

10. The method according to claim 9, which comprises: transmitting the additional information as a byte.

11. The method according to claim 1, which comprises: transmitting the region-by-region comparison results as hexadecimally coded additional information.

12. A method for testing semiconductor memory modules, comprising:
storing data in a memory bank having an addressable matrix structure containing rows and columns, and locations where the rows and columns intersect defining addresses;
subdividing the locations of each column into a plurality of regions;
counting defect locations occurring in each one of the regions separately from one another in a column by column manner;
obtaining comparison results by comparing a number of the counted defect locations in each one of the regions with a threshold value separately from one another in a column by column manner; and
transmitting the region-by-region comparison results as additional information in a column by column manner to an external test device, and transmitting the comparison results to the external test device together with defect addresses of defect locations in the memory bank.

13. The method according to claim 12, which comprises: providing the threshold value being greater than 2.

14. The method according to claim 12, which comprises: providing the threshold value being greater than 1.

15. The method according to claim 14, which comprises: transmitting the additional information as a byte.

16. The method according to claim 15, which comprises: generating the additional information it the comparison results are not less than the threshold value.

17. The method according to claim 14, which comprises: generating the additional information if the comparison results are not less than the threshold value.

18. The method according to claim 12, which comprises: generating the additional information if the comparison results are not less than the threshold value.

19. The method according to claim 12, which comprises: transmitting the additional information as a byte.

20. The method according to claim 12, which comprises: qualifying the additional information depending on whether the defect locations are contained in one of the regions or in a plurality of the regions.

21. The method according to claim 20, which comprises: transmitting the additional information as a byte.

22. The method according to claim 12, which comprises: transmitting the region-by-region comparison results as hexadecimally coded additional information.

* * * * *